United States Patent
Rada et al.

(10) Patent No.: US 9,621,203 B2
(45) Date of Patent: Apr. 11, 2017

(54) MEDIUM COMMUNICATION SYSTEM USING LOG DETECTOR AMPLIFIER

(71) Applicant: DockOn A.G., Zurich (CH)

(72) Inventors: Patrick Rada, San Diego, CA (US); Forrest Brown, Carson City, NV (US)

(73) Assignee: DOCKON AG, Zurich (CH)

( * ) Notice: Subject to any disclaimer, the term of this patent is extended or adjusted under 35 U.S.C. 154(b) by 280 days.

(21) Appl. No.: 14/095,969

(22) Filed: Dec. 3, 2013

(65) Prior Publication Data

US 2014/0150554 A1 Jun. 5, 2014

(51) Int. Cl.
| | |
|---|---|
| G01F 1/66 | (2006.01) |
| G01M 3/24 | (2006.01) |
| H04B 1/10 | (2006.01) |
| G01M 3/00 | (2006.01) |
| G01F 15/06 | (2006.01) |

(Continued)

(52) U.S. Cl.
CPC .......... *H04B 1/10* (2013.01); *G01F 1/66* (2013.01); *G01F 1/663* (2013.01); *G01F 1/667* (2013.01); *G01F 15/063* (2013.01); *G01M 3/00* (2013.01); *G01M 3/243* (2013.01); *H03D 3/002* (2013.01); *H04Q 9/00* (2013.01); *H04Q 2209/40* (2013.01); *H04Q 2209/43* (2013.01)

(58) Field of Classification Search
CPC ... H04B 1/10; G01F 1/66; G01F 1/667; G01F 1/663; G01F 15/063; G01M 3/00
USPC ... 73/40.5 A, 579, 587, 592, 861.19, 861.21, 73/861.25, 861.26, 861.27, 861.28, 73/861.29, 861.31
See application file for complete search history.

(56) References Cited

U.S. PATENT DOCUMENTS

| | | | |
|---|---|---|---|
| 2,363,651 A | 11/1944 | Crosby | |
| 2,644,081 A | 6/1953 | Donald | |

(Continued)

FOREIGN PATENT DOCUMENTS

| | | |
|---|---|---|
| EP | 0283401 A2 | 9/1988 |
| EP | 1384281 A2 | 1/2004 |

(Continued)

OTHER PUBLICATIONS

Insam; "Designing Super-Regenerative Receivers"; Electronic World; Apr. 2002; 19 pages.

(Continued)

*Primary Examiner* — Laura Martin
*Assistant Examiner* — Rose M Miller
(74) *Attorney, Agent, or Firm* — Baker & Hostetler LLP

(57) ABSTRACT

An in-medium monitoring system for monitoring material carried within a pipe. The system includes an acoustic device installed within the pipe that generates voltage signals indicative of changes in the material, such as flow rate or leaks, a hardware unit that includes a detector module and a communication module, a switch for switching the voltage signals to and communication signals from the hardware unit. The hardware unit and a power source are attached to the pipe. The acoustic device may be detector or a sensor. The communication module may communicate date through the sensor in the medium or outside of the pipe to a fixed network. The hardware unit may include a log detection amplifier for generating an amplified pulsed output signal without voltage gain and without significantly adding noise.

23 Claims, 11 Drawing Sheets

(51) Int. Cl.
H03D 3/00 (2006.01)
H04Q 9/00 (2006.01)

(56) References Cited

U.S. PATENT DOCUMENTS

| | | |
|---|---|---|
| 3,092,779 A | 6/1963 | De Niet |
| 3,199,031 A | 8/1965 | Harris et al. |
| 3,320,530 A | 5/1967 | Pearman |
| 3,337,807 A | 8/1967 | Brown |
| 3,602,819 A | 8/1971 | Abbott et al. |
| 3,668,535 A | 6/1972 | Lansdowne |
| 3,724,954 A | 4/1973 | Dreyfoos |
| 3,791,272 A | 2/1974 | Nobusawa |
| 3,965,426 A | 6/1976 | Ringland |
| 4,034,298 A | 7/1977 | McFadyen et al. |
| 4,042,883 A | 8/1977 | Rae |
| 4,160,953 A | 7/1979 | Matsuura et al. |
| 4,393,514 A | 7/1983 | Minakuchi et al. |
| 4,510,624 A | 4/1985 | Thompson et al. |
| 4,577,503 A * | 3/1986 | Imaino .................. G01H 3/12 73/579 |
| 4,579,005 A * | 4/1986 | Brown .................. G01P 5/242 73/861.25 |
| 4,609,994 A | 9/1986 | Bassim et al. |
| 4,660,192 A | 4/1987 | Pomatto |
| 4,882,768 A | 11/1989 | Obana et al. |
| 4,972,512 A | 11/1990 | Garskamp |
| 4,979,186 A | 12/1990 | Fullerton |
| 1,424,065 A | 7/1992 | Armstrong |
| 5,479,442 A | 12/1995 | Yamamoto |
| 5,621,756 A | 4/1997 | Bush et al. |
| 5,771,026 A | 6/1998 | Stengel |
| 5,789,996 A | 8/1998 | Borodulin |
| 5,818,875 A | 10/1998 | Suzuki et al. |
| 5,995,814 A | 11/1999 | Yeh |
| 6,035,002 A | 3/2000 | Schleifer |
| 6,054,900 A | 4/2000 | Ishida et al. |
| 6,389,275 B1 | 5/2002 | Kawashima et al. |
| 6,420,937 B1 | 7/2002 | Akatsuka et al. |
| 6,421,535 B1 | 7/2002 | Dickerson et al. |
| 6,518,856 B1 | 2/2003 | Casale et al. |
| 6,538,528 B2 | 3/2003 | Louzir et al. |
| 6,574,287 B1 | 6/2003 | Swaminathan et al. |
| 6,668,165 B1 | 12/2003 | Cloutier |
| 6,668,619 B2 | 12/2003 | Yang et al. |
| 6,670,849 B1 | 12/2003 | Damgaard |
| 6,671,331 B1 | 12/2003 | Sakuma |
| 7,215,936 B2 | 5/2007 | Sadowski |
| 7,400,904 B2 | 7/2008 | Cornwall et al. |
| 7,423,931 B2 | 9/2008 | Martin et al. |
| 7,567,099 B2 | 7/2009 | Edwards et al. |
| 7,612,616 B2 | 11/2009 | Deng |
| 7,751,857 B2 | 7/2010 | Beumer et al. |
| 7,751,996 B1 | 7/2010 | Ardizzone et al. |
| 7,819,022 B2 | 10/2010 | Hope |
| 7,848,384 B2 | 12/2010 | Pelissier et al. |
| 7,911,235 B2 | 3/2011 | Brown |
| 8,040,204 B2 | 10/2011 | Brown |
| 8,064,864 B2 | 11/2011 | Rofougaran |
| 8,144,065 B2 | 3/2012 | Brown |
| 8,149,173 B2 | 4/2012 | Brown |
| 8,164,532 B1 | 4/2012 | Brown |
| 8,265,769 B2 | 9/2012 | Denison |
| 8,326,340 B2 | 12/2012 | Nalbantis et al. |
| 8,364,098 B2 | 1/2013 | Ridgers |
| 8,368,485 B2 | 2/2013 | Brown |
| 8,385,910 B2 | 2/2013 | Nazrul et al. |
| 8,462,031 B2 | 6/2013 | Belot et al. |
| 8,542,768 B2 | 9/2013 | Kim et al. |
| 8,644,776 B1 | 2/2014 | Nobbe et al. |
| 8,655,441 B2 | 2/2014 | Fletcher et al. |
| 8,676,521 B2 | 3/2014 | Vennelakanti et al. |
| 2001/0037676 A1 * | 11/2001 | Chang .................. G01F 1/66 73/114.33 |
| 2002/0109607 A1 | 8/2002 | Cumeralto et al. |
| 2004/0036554 A1 | 2/2004 | Veyres et al. |
| 2004/0229585 A1 | 11/2004 | Lu et al. |
| 2004/0240588 A1 | 12/2004 | Miller |
| 2005/0003785 A1 | 1/2005 | Jackson et al. |
| 2005/0009480 A1 | 1/2005 | Vakilian et al. |
| 2005/0069051 A1 | 3/2005 | Lourens |
| 2005/0270172 A1 | 12/2005 | Bailey et al. |
| 2006/0028297 A1 | 2/2006 | Kang et al. |
| 2006/0226897 A1 | 10/2006 | Ruijter |
| 2007/0030099 A1 | 2/2007 | Carpentier et al. |
| 2007/0066265 A1 | 3/2007 | May |
| 2007/0105521 A1 | 5/2007 | Granata |
| 2007/0139130 A1 | 6/2007 | Kim et al. |
| 2007/0207749 A1 | 9/2007 | Rozenblit et al. |
| 2008/0101185 A1 | 5/2008 | Rozenblit et al. |
| 2008/0176529 A1 | 7/2008 | Lau |
| 2008/0269841 A1 | 10/2008 | Grevious et al. |
| 2009/0079524 A1 | 3/2009 | Cyr et al. |
| 2009/0079607 A1 | 3/2009 | Denison et al. |
| 2009/0147837 A1 | 6/2009 | Lau |
| 2009/0322544 A1 | 12/2009 | McDowell |
| 2010/0080270 A1 | 4/2010 | Chen et al. |
| 2010/0152644 A1 | 6/2010 | Pesach et al. |
| 2010/0225417 A1 | 9/2010 | Mistretta et al. |
| 2010/0308999 A1 | 12/2010 | Chornenky |
| 2010/0313958 A1 | 12/2010 | Patel et al. |
| 2011/0007844 A1 | 1/2011 | Park et al. |
| 2011/0018777 A1 | 1/2011 | Brown |
| 2011/0037516 A1 | 2/2011 | Nejati et al. |
| 2011/0093220 A1 | 4/2011 | Yang et al. |
| 2011/0212692 A1 | 9/2011 | Hahn et al. |
| 2011/0234316 A1 | 9/2011 | Kim et al. |
| 2011/0301882 A1 | 12/2011 | Andersen |
| 2012/0019336 A1 | 1/2012 | Khan et al. |
| 2012/0106560 A1 | 5/2012 | Gumaste |
| 2012/0112852 A1 | 5/2012 | Manssen et al. |
| 2012/0121030 A1 | 5/2012 | Luo et al. |
| 2012/0164644 A1 | 6/2012 | Neely et al. |
| 2012/0190317 A1 | 7/2012 | Martineau et al. |
| 2012/0280754 A1 | 11/2012 | Gorbachov |
| 2013/0029350 A1 | 1/2013 | Cooper et al. |
| 2013/0059548 A1 | 3/2013 | Umeda et al. |
| 2013/0113666 A1 | 5/2013 | Orsi et al. |
| 2013/0128934 A1 | 5/2013 | Kang et al. |
| 2013/0222058 A1 | 8/2013 | Maniwa et al. |
| 2014/0154991 A1 | 6/2014 | Brown et al. |
| 2014/0171002 A1 | 6/2014 | Park et al. |
| 2014/0266420 A1 | 9/2014 | Brown et al. |
| 2014/0266962 A1 | 9/2014 | Dupuy et al. |
| 2014/0269972 A1 | 9/2014 | Rada et al. |
| 2014/0273898 A1 | 9/2014 | Brown et al. |
| 2014/0287704 A1 | 9/2014 | Dupuy et al. |

FOREIGN PATENT DOCUMENTS

| | | |
|---|---|---|
| GB | 2354329 A | 3/2001 |
| JP | 56-138340 A | 10/1981 |
| JP | 56-138342 A | 10/1981 |
| JP | S 60-249436 A | 12/1985 |
| JP | 10-075273 A | 3/1998 |
| WO | WO 00/35124 A2 | 6/2000 |
| WO | WO 02/084782 A2 | 10/2002 |
| WO | WO 2008/018836 A1 | 2/2008 |
| WO | WO 2008/075066 A2 | 6/2008 |
| WO | WO 2012/153147 A1 | 11/2012 |

OTHER PUBLICATIONS

International Patent Application No. PCT/US2014/029832; Int'l Preliminary Report on Patentability; dated Mar. 11, 2015; 7 pages.
U.S. Appl. No. 14/213,529, filed Mar. 14, 2014, Rada et al.
U.S. Appl. No. 14/216,945, filed Mar. 17, 2014, Rada et al.
Sanders B.J.; "Radical Combiner Runs Circles Around Hybrids," MicroWaves; Nov. 1980; vol. 19, No. 12; p. 55-58.
Caloz et al.;"Metamaterials for High-Frequency Electronics"; Proceedings of the IEEE; vol. 93; No. 10; Oct. 2005; p. 1744-1752.
International Patent Application No. PCT/US2014/029577; Int'l Preliminary Report on Patentability; dated Jun. 19, 2015; 17 pages.

(56) References Cited

OTHER PUBLICATIONS

European Patent Application No. 13860466.5; Extended Search Report; dated Jul. 27, 2016; 7 pages.
European Patent Application No. 13859934.5; Extended Search Report; dated Jul. 27, 2016; 9 pages.

* cited by examiner

MEDIUM COMMUNICATION SYSTEM USING LOG DETECTOR AMPLIFIER

CROSS REFERENCE TO RELATED APPLICATIONS

This application claims benefit under 35 U.S.C. §119(e) of Provisional Application No. 61/732,848, filed Dec. 3, 2012, the entire contents of which are incorporated herein by reference.

TECHNICAL FIELD

The present disclosure relates to the transmission of data through a medium using a modulated base band signal that is demodulated on a receiver side to extract the transmitted data.

BACKGROUND

Present systems that measure the condition of a medium, such as water, oil, gas, air, etc., rely upon detection devices, such as flow meters, leak detectors, pressure sensors, etc., that are attached to the outside of the infrastructure carrying the medium so that data collected by the sensors may be transmitted to a separate communication device, such as an antenna that transmits the data through a different medium, such as open space, some short range to another devices, that passes the data along to some central monitoring system.

For example, water leak detection units for detecting leaks in municipal and residential water pipes typically rely upon some type of sensor, such as accelerometer or microphone, which is attached to the pipe and listens to vibrations within the pipe. The leak detector may then be attached to an endpoint device, such as in a metal or plastic pit installed in the ground, which is then connected to an antenna that transmits data from the sensor to a central system, probably through one or more intermediary devices. Such detectors may be relatively inexpensive fixed systems, in exchange for poorer performance and a short transmission range, or very expensive transient systems, in exchange for moderately better performance, but which still tend to have a short transmission range.

Some of the issues associated with such systems include: (1) low received sensitivity due to transverse measurements; (2) strong pipe effects due to the sensor measuring the convolution of the pipe's self-resonance along with the vibrations in the water; and (3) a poor environment for a fix wireless communications network. With regard to this later issue, consider that the typical leak detector and endpoint devices are installed in a pit, generally submerged by water, surrounded by reinforced concrete, and covered with a metal plate for a lid on the pit. Radio frequency (RF) propagation to a central system or intermediary device in such an environment is very difficult. At 915 MHz, even a plastic lid can result in 6 dB of loss, with a solid metal lid resulting in as much as 25 dB of loss. Transmission can be improved, marginally, by placing an antenna outside of the pit and above the lid, but doing so requires a custom cable for transmission of the RF signals from the endpoint to the antenna, and placing the antenna above ground leaves the antenna susceptible to environmental damage and conditions, vandalism, theft, etc. Leak detectors in such environments are also generally separated from other types of detectors, such as a flow meter or pressure sensor.

While a water supply system is described above, sewage, oil and gas transmission lines, industrial applications, and many other types of similar systems experience similar shortcomings to those described herein.

SUMMARY

An in-medium communication system is described that may be installed within the infrastructure carrying the medium, the system connected to one or more sensors for sensing the condition of the medium and transmitting a base band signal modulated in the transmitter with the sensor received data that is then sent via an acoustic signal thru the medium to a receiver that receives the modulated signal and demodulates the modulated signal to extract the sensor data.

DETAILED DESCRIPTION OF ILLUSTRATIVE EMBODIMENTS

Embodiments described herein include an in-medium communication network or system that is accurate, reliable and less expensive to maintain than existing networks or systems. The herein described system includes a fixed network, such an in-liquid communication mesh network, an in-liquid local area network, or a combination of the two, for detecting leaks and otherwise monitoring pipelines, such as municipal and residential water pipes or other infrastructure for carrying other mediums, such as sludge, gas, etc. Embodiments use the properties of the medium, such as water, to longitudinally propagate signals, versus propagating the signals transverse to the infrastructure (e.g., a pipe) of the medium. Propagation in pipe remains possible despite crossing one or more 90 degree elbow connectors or crossing from pipe to pipe with different diameters and material compositions, such as polyvinyl chloride (PVC) to metal. As the communication network is installed one the infrastructure, the sensors may also be installed within the infrastructure, such as a hydrophone within the pipe for use in leak detection, provided such sensors are capable of withstanding water hammer effects from pressure waves, e.g., 100-500 pounds per square inch (PSI).

Figure 1:
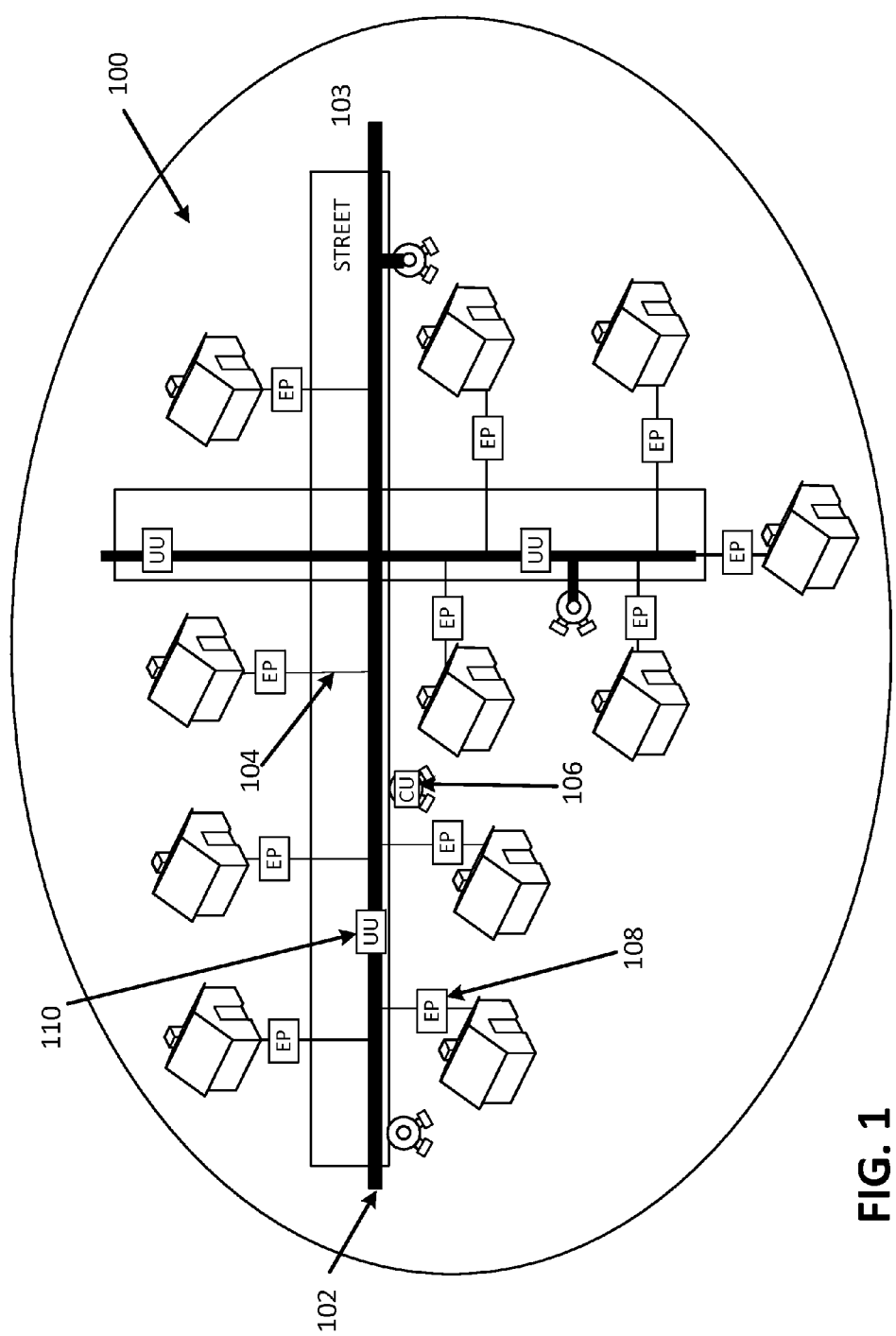
FIG. 1 is an illustration of an embodiment of a deployment of monitoring units in a cell of a network.

FIG. 1 illustrates an embodiment of a cell of an in-medium local area network 100 for a residential drinking water supply system including one or more municipal water lines 102 and a plurality of the end user water lines 104 under or partially under a street 103. Such cells may include a single central unit 106, a plurality of user end points 108 and one or more repeater utility units 110 within a predetermined geographic area, such 300 square feet by 300 square feet. The smaller user end points 108 are installed within the end user water lines 104, while the larger central units 106 and utility units 110 are installed within the municipal water lines. To improve the reach and communication quality of in medium communication in a cell, units 108 and 106 may communicate directly one to one or by means of a mesh network (daisy chain) fashion. In one instance the data from the end point 108 the farthest west in the cell may communicate directly with central unit 106. In a second scenario, the same end point 108 may communicate daisy chain from unit to unit using other 108 or 110 units) to the central unit 106 and vice and versa. This, of course, is just one example and cells may include more than one central unit 106, only a single user end point 108, and only a single utility unit 110, and cover any of a number of different sizes of geographic areas. Cells may also include additional elements not shown in FIG. 1. A larger network may include a plurality of such cells configured in a mesh network, where each cell communicates with each other cell, or a partial mesh where at least some of the cells communicate with each of a number of other cells. Depending on the structure of the network and the intended usage, the network may be limited to single direction or bi-directional communication.

The end point unit 108, the utility unit 110 and the central unit 106 may be substantially the same in composition, although the end point unit 108 may be uni-directional, i.e., just capable of transmitting, while the utility unit 110 and central unit 106 are bi-directional so they can receive and transmit. In embodiments, a leak detector, a flow meter and other sensors may be combined with a communication unit into a single device, with integral sensors and antenna(s), when possible. In embodiments, part of the central unit 106 may be located above ground, such as three to six feet high, such as on top of a water hydrant or other component of the infrastructure, while the sensors of the unit are located within the pipe. Placing the central unit 106 above ground may allow for optimal wireless communication with a central monitoring system, which may be operated by a provider of the water or other medium.

An in-medium network of the type described with reference to FIG. 1, including one or more cells 100, may perform various functions efficiently, such a leak detection, flow monitoring, pressure monitoring, temperature measurements, and then consolidate and communicate that data to an overall central monitoring system. Advanced communication protocols, such WiFi, BLUETOOTH or ZIGBEE, and advanced modulation techniques, such as orthogonal frequency-division multiplexing (OFDM), to address liquid and pipe impairments, may be utilized to transmit and receive the modulated signals, with the liquid in the pipes operating as the subcarrier. Custom made protocols may be created, but for the sake of simplicity, existing protocols may be used or customized in some manner.

In embodiments, and as further described herein, a log detector amplifier (LDA) may be used to further improve communication between the links of the network, while also improving leak detection, flow metering, and pressure and temperature measurements. An LDA may enable transmitter power measurements in a high dynamic range, e.g., 100 dB, with high receive sensitivity, direct amplitude modulation (AM) or frequency modulation (FM) demodulation, phase demodulation with a phase lock loop (PLL), and regeneration of the signal-to-noise ratio (SNR) for modulated received signals. This may enable the use of meters with crystal sensors and enable better range for the communication network, with better SNR and higher data rates. Embodiments may also enable high receive sensitivity, micro-volt amplification, and regeneration of SNR for baseband received signals (with an additional PLL or voltage controller oscillator (VCO)).

In an LDA the received signal may be demodulated to baseband from the repetition frequency with a frequency to voltage converter followed by a conventional N-bits analog to digital converter to v(k) or using a repetition frequency that is a quasi-digital intermediate frequency that carries the information F(t). A digital period meter may be used by the micro-controller to measure the period from pulse to pulse, i.e., M to M+1, M+1 to M+2, etc. Through a digital counter and fast clock the signal may be inverted digitally to F(k) and scaled to v(k)'=v(ref)+K*F(k). After calibration, at the end of the process, v(k)'=v(k).

Figure 2:
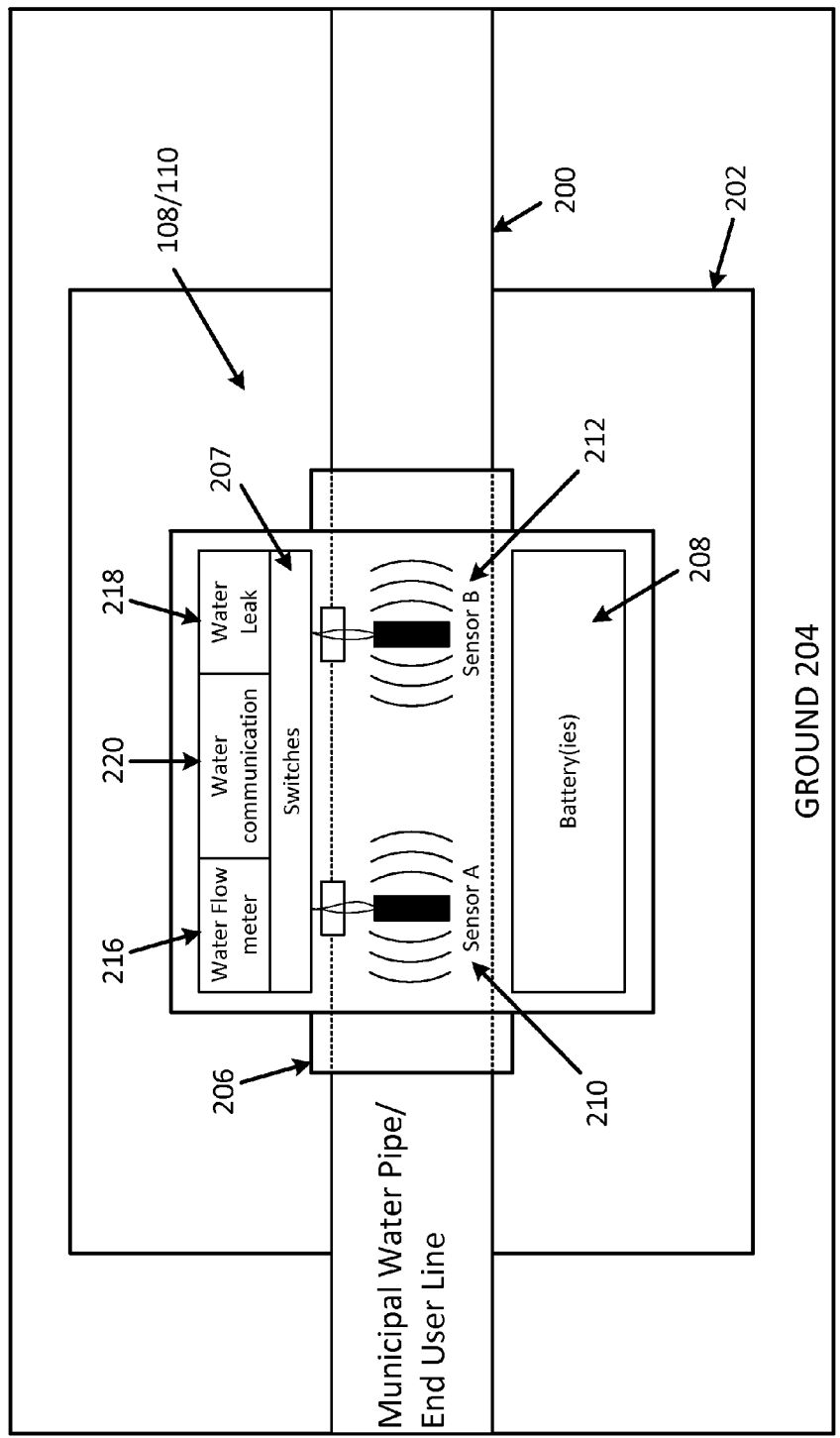
FIG. 2 is an illustration of an embodiment of a unit mounted to a pipe.

FIG. 2 illustrates embodiments of a user end point or end point unit 108 and/or a utility unit 110 installed on a pipe 200 running through a typical pit 202 dug into the ground 204. The illustrated embodiments of units 108/110 can perform numerous functions, such as in-medium communication, flow metering, water leak detection, and pressure/temperature measurements, all in one device. In this embodiment, the pipe 200 is cut and the unit 108/110 is installed in the line of the pipe 200 by joints 206 on either side of the unit 108/110 to the pipe 200. The unit 108/110 integrates as much hardware as possible into a hardware unit 207, including the battery/batteries 208 for powering the unit 108/110, one or more sensors, such as water flow sensor and/or a leak detection sensor 210 and a receive/transmit sensor 212, one or more switches 214 for controlling the sensors 210/212, a water leak detector 216 and/or a water flow meter 218, and a water communication controller 220. The water flow and leak detection sensors 210 may be acoustic sensors that are placed inside the water line 200 and use longitudinal sonic waves for best range and sensitivity. The water leak detector 216, water flow meter 218, and water communication controller 220 may each include LDA circuitry for high sensitivity and low noise operation. An example of a LDA, also called a logarithmic detector, is described in U.S. Pat. No. 7,911,235, which is incorporated in its entirety herein.

Figure 3:
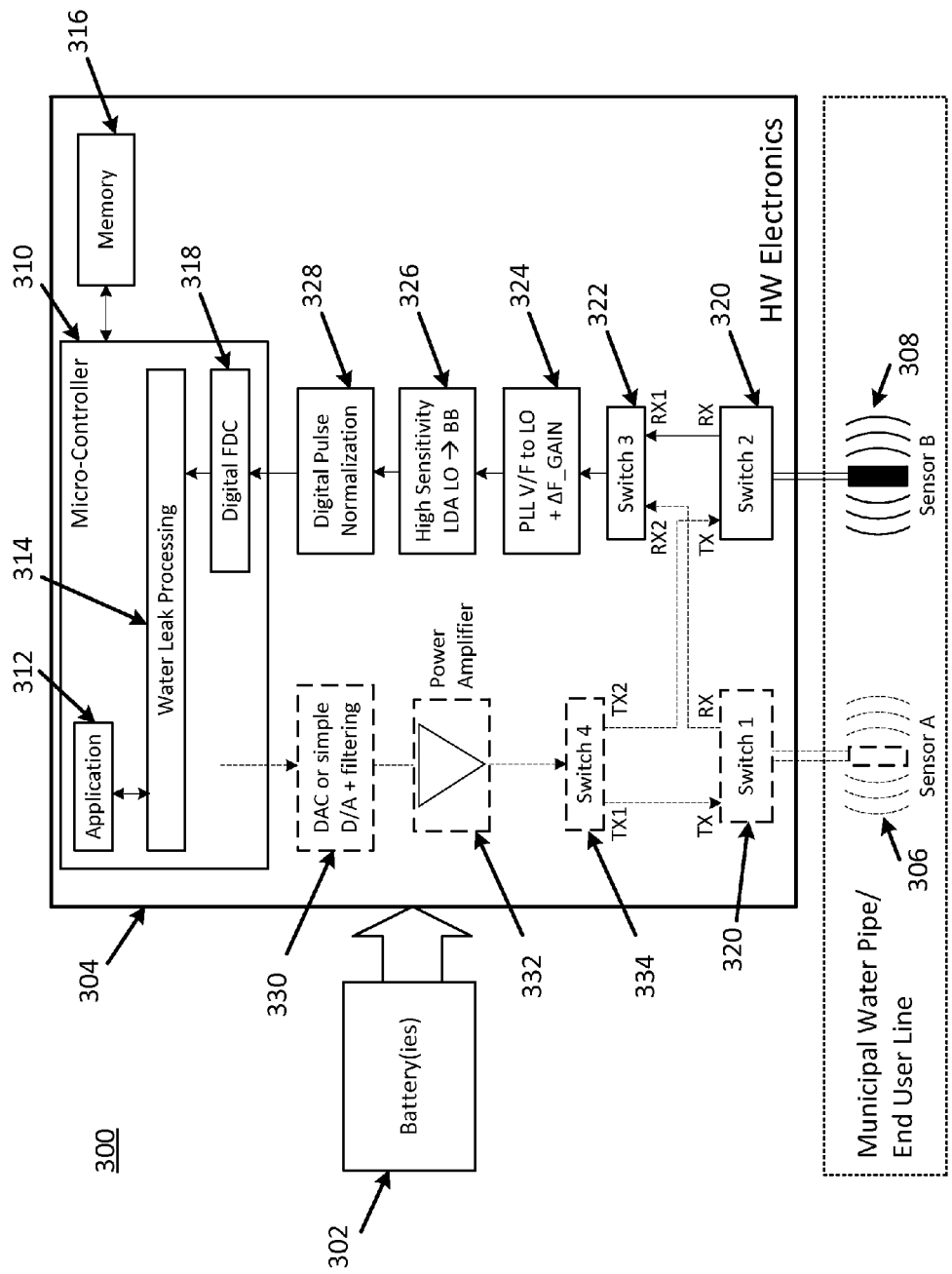
FIG. 3 is an illustration of an embodiment of a unit with a leak detection meter and a log detection amplifier that may operate in receive only or both receive and transmit in-medium.

FIG. 3 illustrates an embodiment of an end point unit, utility unit or central unit (collectively, a "unit") 300 configured for leak detection with a target range of about 100 feet as an end point unit and about 300 feet as a utility unit or central unit. The battery 302 provides power to the hardware unit 304, which is connected to two sensors 306 and 308. The hardware unit 304 includes a micro-controller or central processing unit 310 that operates one or more applications 312, such as communications applications, water leak processing applications 314, operating in conjunction with memory 316. The micro-controller may also include a frequency to digital converter (FDC) 318.

In operation, sensor 308 may be an acoustic detector or sensor/transceiver (all referred to as "sensors" herein) that may operate in transmit (TX) and receive (RX) mode, or just RX mode, e.g., 20 Hz to 5 KHz. In RX mode, the sensor 308 may include one or more hydrophones (immerged acoustic microphone) or piezoelectric crystals that generate a voltage when force, such as sound or pressure, is applied to them. In TX mode, the hydrophone or piezoelectric crystals of the sensor 308 may change size when a voltage is applied across them causing them to oscillate at very high frequencies, thereby producing sound waves, e.g., 10 Hz to 10 KHz. Voltage signals generated by the sensor 308 are input to a switch 320 that outputs the received signal to a second switch 322 as RX1.

The output from switch 322 is received by PLL 324, which performs a voltage to frequency conversion of the received signal with conversion gain in KHz per milliVolt to an intermediate frequency (LO), without voltage amplification, and outputs the frequency modulated signal to the log detector amplifier (LDA) 326, which demodulates that frequency modulated signal at the intermediate frequency to generate an amplified pulsed output signal without a voltage gain and substantially minimal added noise. If it is desired to convert the intermediate frequency to a baseband frequency, the LDA may also include a frequency to voltage converter (not shown in FIG. 3). The noise is kept to a substantial minimum since no voltage amplification occurs, but instead, amplifying through a direct voltage to frequency conversion, with a very clean single frequency carrier or a single frequency tone (with high spectral purity) inside the PLL that moves up and down in frequency following the input voltage. The LDA 326 operates concurrently as both an FM and AM demodulator. Since both demodulations are processed concurrently, there is a gain of up to 6 dB in demodulation versus a standard FM demodulator. The input signal from the PLL is high amplitude, and as such, far above the noise floor, so the LDA demodulates this input signal in the best of conditions with minimal additional noise.

The amplified output signal from the LDA 326 is then shaped by the digital pulse normalization circuit 328 to create a digital-like output signal, which is then converted to a digital signal by FDC 318 so that the data signal can be processed by the water leak processing application 314 and any other applications 312 of the micro-controller 310.

The micro-controller 310 outputs a digital signal that includes data indicative of any leak detected by the sensor 308, which is then converted to an analog signal by a digital to analog converter (DAC) 330, which is then amplified by a power amplifier 332. Switch 334 may then route the amplified data signal to switch 336, if sensor 306 is being utilized to transmit the amplified data signal within the cell or network to which unit 300 belongs. If sensor 306 is not a transmitter, then switch 334 may route the amplified data signal to switch 320, so sensor 308 may be used to transmit the signal.

Figure 4:
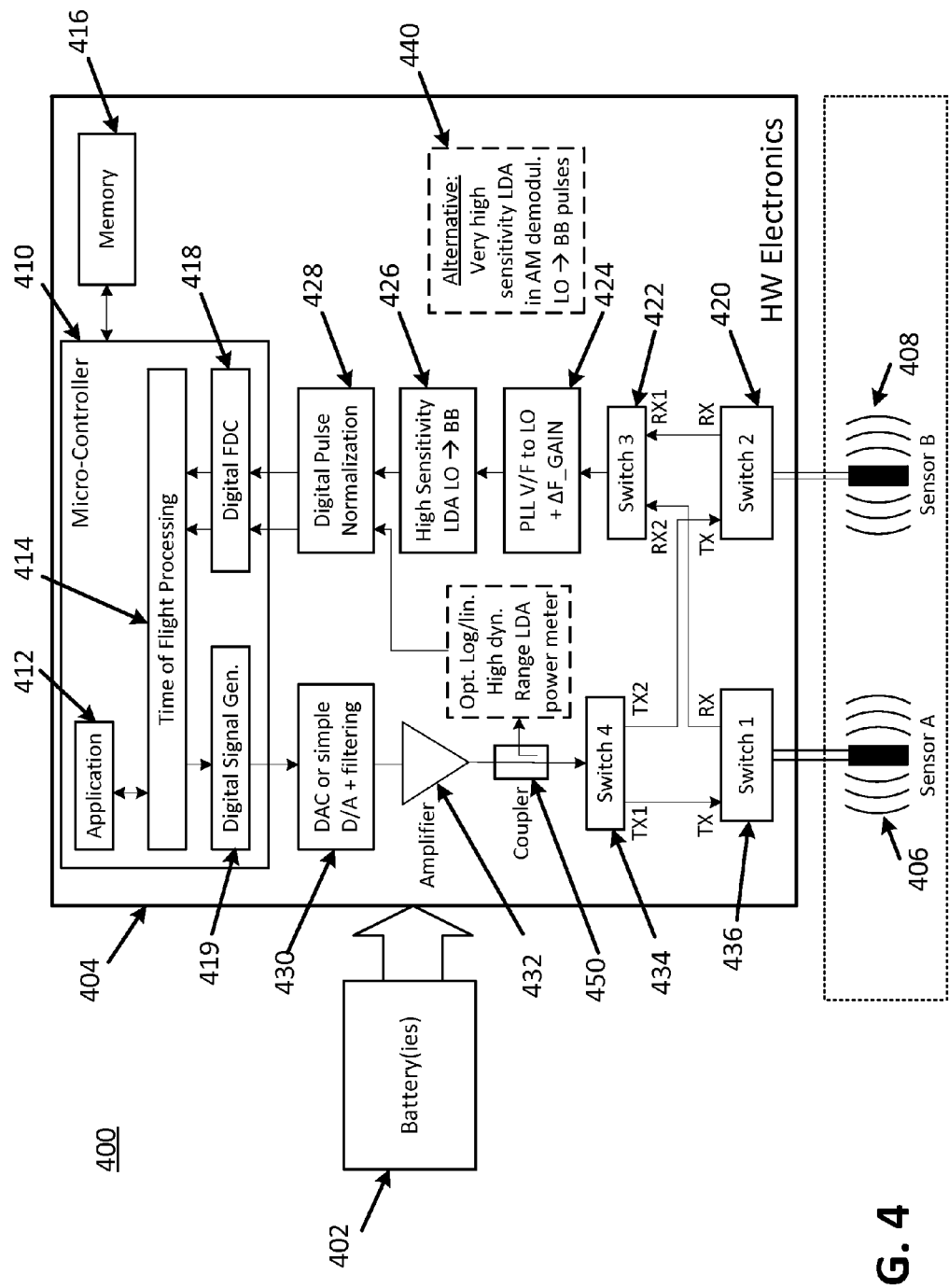
FIG. 4 is an illustration of an embodiment of a unit with a flow rate meter and a log detection amplifier, as well as a second log detection amplifier for adjusting output levels, that may operate in both receive and transmit in-medium.

FIG. 4 illustrates an embodiment of a unit 400 configured for flow rate monitoring. As already illustrated and described in relation to FIG. 3, the battery 402 provides power to the hardware unit 404, which is connected to two sensors 406 and 408. The hardware unit 404 includes micro-controller 410 that operates one or more applications 412, including time of flight processing application 414, operating in conjunction with memory 416. The micro-controller 410 may include FDC 418 and a digital signal generator 419. In FIG. 4, sensors 406 and 408 may both be acoustic sensor, with sensor 406 operating in TX/RX mode and sensor 408 operating in RX/TX mode, the point of which will be further explained below.

As described with respect to FIG. 3, in FIG. 4, voltage signals generated by the sensor 408 are input to a switch 420 that outputs the received signal to a second switch 422. The output from switch 422 is received by PLL 424, which converts the signal and outputs a frequency modulated signal to the LDA 426. The LDA demodulates the signal from the PLL concurrently in AM and FM mode and outputs an amplified signal that is then shaped by the digital pulse normalization circuit 428 and processed by the time of flight processing application 414 and any other applications 412 of the micro-controller 410. Digital signals including data indicative of the flow rate of liquid, gas or other materials in the pipe 401, are output by the micro-controller 410, converted to analog signals by DAC 430, and routed by switch 434 to either switch 436 or switch 420. The switches 420, 422, 434 and 436 may be replaced by any similar switch system, such as a switch matrix, a single double pull, double throw (DTDP) with two ins and two outs. As noted above, the unit 400 operates as a flow meter, which also requires voltage signals from sensor 406 to be routed from switch 436 to switch 422 so voltage signals from sensor 406 can be processed in the same manner as voltage signals from sensor 408, and for signals to be transmitted by sensor 408 in the same manner as sensor 406.

As illustrated in FIG. 4, the flow meter may operate using time of flight calculations. Other flow measurement methods may also be used with the hardware architecture depicted in FIG. 4 or similar hardware architecture. The flow rate of the liquid, gas or other material in the pipe 401 flowing in one direction, say, from sensor 406 to sensor 408 may accelerate the time of flight of the acoustic signal sent from 406 and received by 408 and oppositely slow down the acoustic signal time of flight sent in the opposite direction vs. the material flow from 408 to 406. The difference in the time of flight (or phase when the delta time is very small) between both cases may be proportional or inversely proportional to the flow of material. The time of flight computation may utilize the high frequency range of the acoustic sensor 406, e.g., 2 MHz., and operate in continuous wave (CW) at 2 MHz, in burst CW, in Gaussian envelope amplitude burst, in frequency burst, in Gaussian envelope frequency burst, or in chirped frequency burst. Since the signal generation output by signal generator 419 is digital, there is a high degree of flexibility in terms of the kind of signal, modulation and envelope generated, such as complex modulation, i.e., orthogonal frequency division multiplex (OFDM), as further described below.

Embodiments illustrated in FIG. 4 may also include an alternative LDA 440 to replace PLL 424 and LDA 426, that may offer even higher sensitivity and other benefits, such as more accurate time of flight determination with the use of repetitive transmitted burst signals 406 (e.g. Gaussian envelope amplitude modulated). Due to the burst nature of the transmitted signals 406/408 and received signals 408/406, the alternative LDA 440 and associated circuitry/processing may reduce interference and minimize the energy spent to measure flow and communicate results, thereby increasing battery life. Embodiment 440 may enable pulsed, bidirectional operation (F1=K*(delta t1−delta t2), pulsed, bidirectional (F1=K*(delta ph1−delta ph2), or pulsed and chirped (F1=(K*Fshf1−K*Fshf2)).

The LDA 440 is regenerative in that it builds up a narrow band signal exponentially, when that signal is in-band of the LDA, over n period of the input signal from the switch 422. A significant amount of the random noise in the input signal is accordingly reduced relative to the desired signal. For example, the LDA 326 may recover a signal buried in noise or with a very low level, amplifying the signal by, say, a factor of 10, without increasing the noise, thereby increasing the SNR, and resulting in at least a 6 dB increase in link budget. The LDA 440 basically operates as follows: One or more resonant circuits are placed around an amplifier to create oscillation. This is the input frequency to the log detector. The amplifier's gain is configured low, as to limit the amount of noise amplified. The log detector discriminates an incoming wanted signal over random noise in that it will pass through the 180 degree phase point of the resonant circuit(s) more frequently than random noise (synchronous build-up). Thus, energy in the oscillation loop builds faster in the presence of a wanted signal. Once energy in this loop reaches a configurable threshold, oscillation is interrupted or quenched. The frequency of the quenching operation is proportional to the logarithm of the input signal's RMS voltage. Furthermore, the LDA can be configured to discriminate AM or FM directly or to perform phase modulation with the adjunction of external circuitry such as a PLL. These "quench pulses" contain the demodulated data. In this manner, the log detector provides noise cancelation and the ability to capture a wanted signal from the noise at very low input levels.

Regarding the transmitter section, as depicted in FIG. 4, the embodiment may also include an optional coupler 450 between amplifier 432 and switch 434, and an optional high dynamic range LDA 452, which operates as a power meter. The benefits of LDA 452 in place of a standard power meter is that LDA 452 provides a huge dynamic range, in the range of 100 dB vs. 50 dB, it provides intrinsic logarithmic conversion of RMS voltage input to frequency, and it provides increased resolution and accuracy. Also as compared to a standard power meter as an amplifier, there is no need for an ADC to convert the analog output voltage to digital, but rather the simpler digital FDC 418 may be used.

Figure 5:
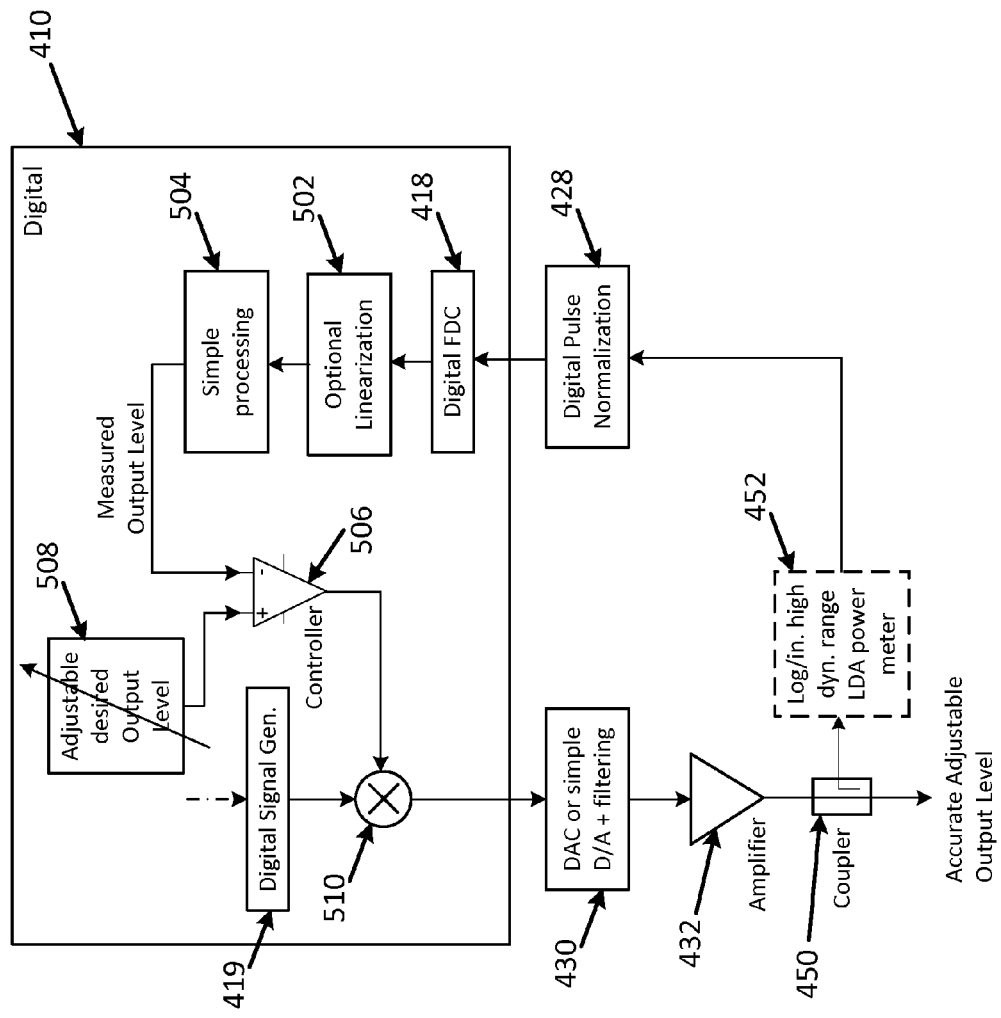
FIG. 5 is an illustration of an embodiment including further details associated with the second log detection amplifier of FIG. 4.

Further details of the LDA power meter circuitry are illustrated in FIG. 5, where the coupler 450 outputs a copy of the amplified data signal to be transmitted to the LDA power meter 452, which processes the amplified data signal in a manner similar to the LDA 426 (in this case amplitude demodulation), and outputs a signal to digital pulse normalization circuit 428 for shaping. Additional electrical circuits or the micro-controller 410 may provide a number of additional elements, such as an optional linearization module 502 and a simple processing module 504, the sequential combination of which generates a measured output level signal as the inverting input to a differential amplifier 506, operating as a controller. The noninverting input to the amplifier 506 is provided by a variable circuit or module 508 that provides an adjustable desired output level. The output of the controller 506 is then mixed with the output of the digital signal generator by mixer 510 to generate an output signal. After further processing by the DAC 430, amplifier 432, and coupler 450, an accurate adjustable output level transmission signal is generated, e.g., continuous wave (CW) at 2 MHz, a burst CW, a Gaussian envelope amplitude burst, a frequency burst, a Gaussian envelope frequency burst or a chirped frequency burst.

Figure 6:
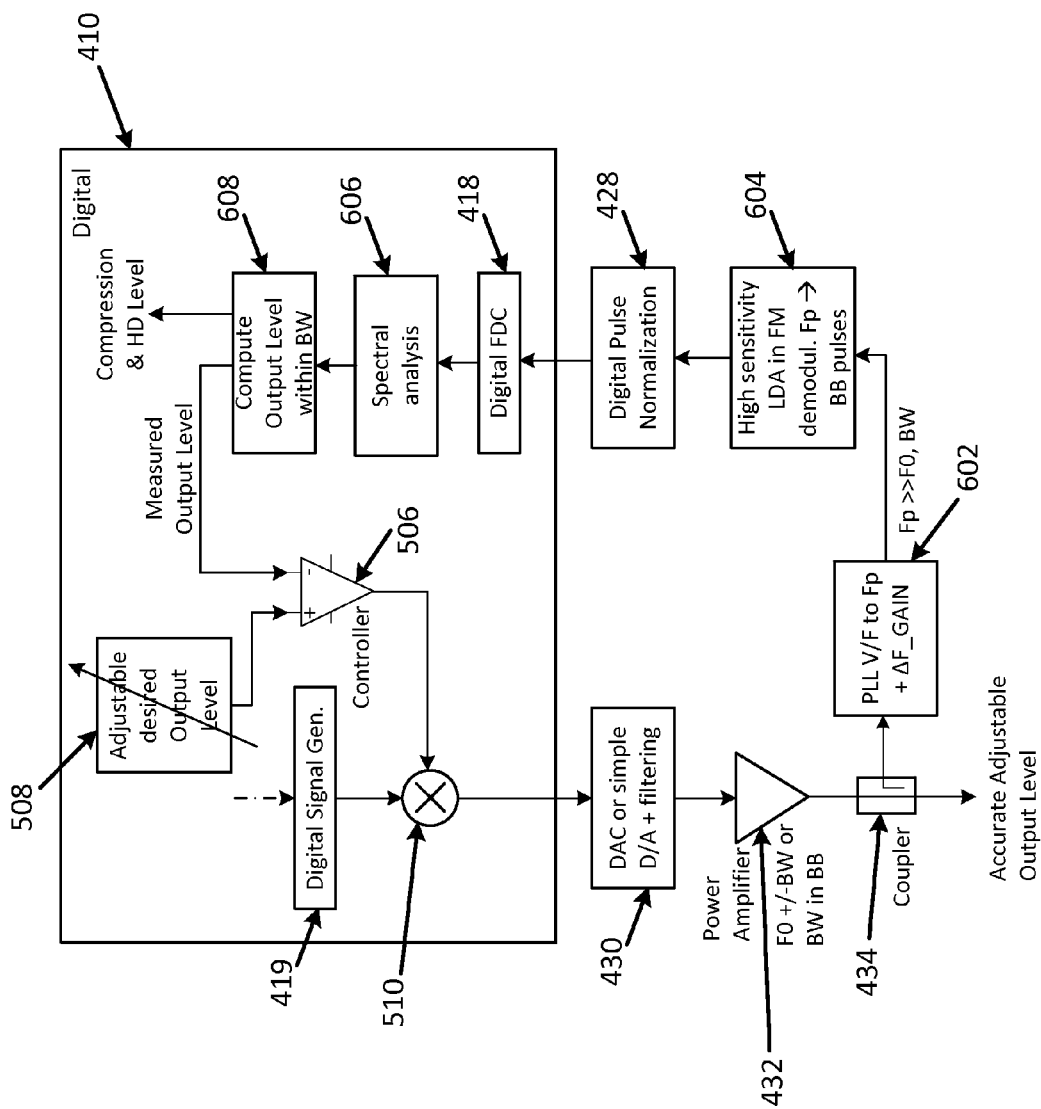
FIG. 6 is an illustration of an embodiment including further details associated with the second log detection amplifier of FIG. 4.

FIG. 6 illustrates a further embodiment on an alternative structure to that illustrated in FIG. 5, in which LDA power meter 452 is replaced by PLL 602, which operates in a manner similar to PLL 424, but converts the input voltage to frequency, without voltage amplification, and outputs the frequency modulated signal to the log detection converter/log detector amplifier LDA 604, which demodulates that frequency modulated signal at the baseband to generate an amplified pulsed output signal without a voltage gain or added noise, as described above. The embodiment of FIG. 6 also includes a frequency spectral analysis circuit/module 606 and an output level processor circuit/module 608 that computes the output level within bandwidth to generated the measure output level for input to the controller 506, as well as a compression and frequency harmonic (HD) level output.

The embodiment illustrated in FIG. 6 may work with any type of power amplifier and measure wideband power. The output level may be sinus to heavily distorted and the TX signal may be in baseband or modulated, such as in frequency modulation (FM), frequency shift key (FSK), pulse modulation, amplitude modulation (AM), etc. The TX signal output level may also be adjustable, while reducing TX interference and providing the ability to detect abnormal TX signals. As with the embodiment of FIG. 5, the embodiment of FIG. 6 offers a high dynamic range, e.g., −70 dBm to +30 dBm. The embodiment reduces interference and minimizes the energy spent to measure flow and communicate results, thereby increasing battery life.

Figure 7:
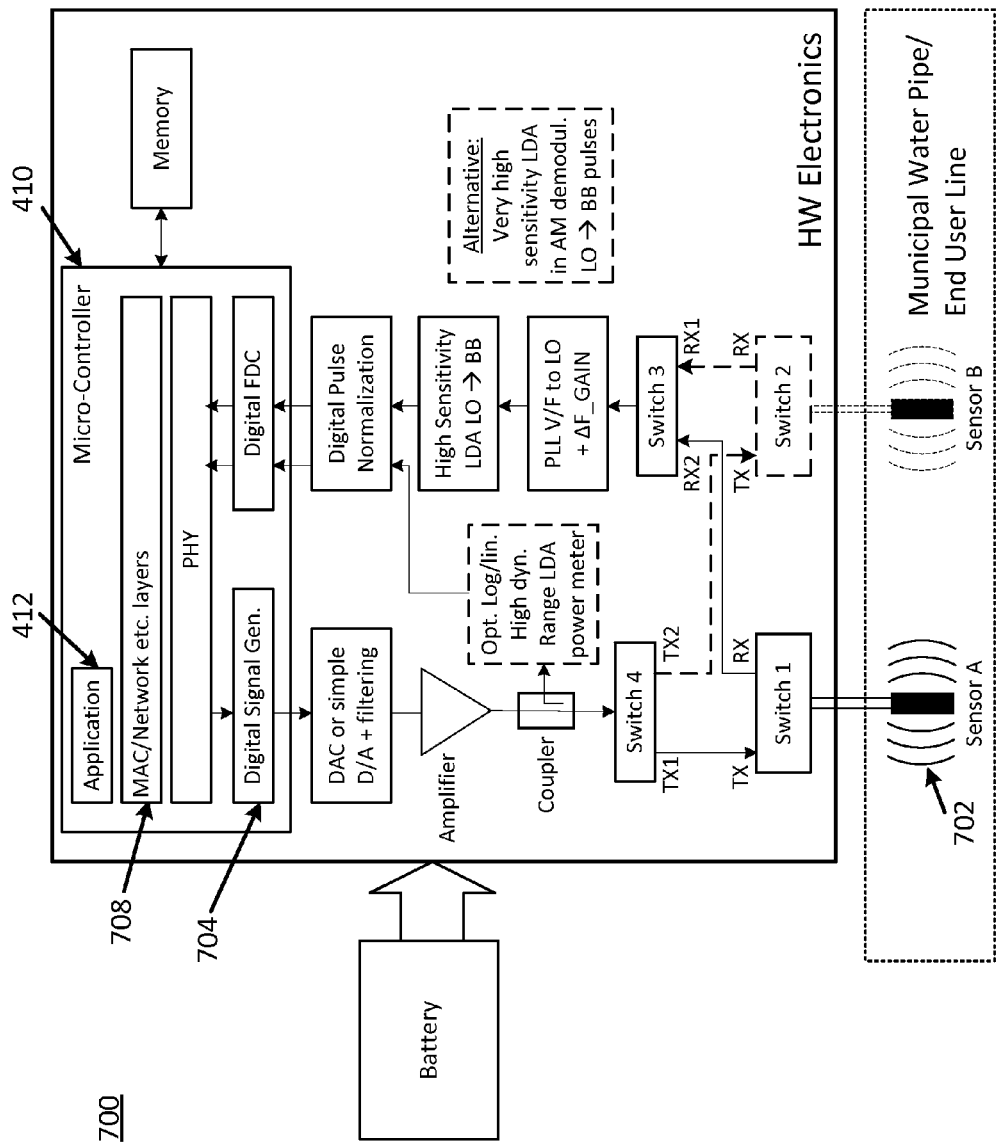
FIG. 7 is an illustration of an embodiment of a unit configured for transmission and reception of data in-medium using one or two ultrasonic devices.

FIG. 7 illustrates embodiments of an end point or utility unit 700 configured to communicate data processed by the unit through the medium within the pipe within which the sensors are placed. In this regard, FIG. 7 is essentially the same as FIG. 4, except some additional elements of micro-controller 410 are illustrated, as further discussed below, and sensor 702 replaces sensor 406. In the embodiment illustrated in FIG. 7, sensor 702 may be an acoustic sensor that operates in transmit/receive TX/RX in time division multiple access TDMA mode with, for instance a carrier frequency of 10 KHz, a 25 Kbps data rate. TDMA enables multiple units within a cell to share the same frequency channel by dividing the signal into different time slots. While TDMA is particular well suited to the embodiments of the units disclosed herein, the present disclosure is not limited to TDMA for transmission or reception. As illustrated in FIG. 7, the micro-controller 410 also includes a physical layer 704 and link layers 708, including media access control (MAC), networking interfaces, and application layer. Physical layer 704 connects application layer 412 and link layer 708 to the sensor 702. In embodiments, the application layer 412, physical layer 704 and the link layers 708 may be integrated in a system-on-a-chip (SOC) implementation.

Various modulations can be used such as digital AM, FM, phase modulation or OFDM. Given the difficult nature of the medium, which has fluid velocity (Doppler shift), high attenuation, and a frequency selective response, an OFDM scheme is the preferred modulation implementation. The data can be spread over n subcarriers and dynamic "water filling" technology may be used to pass the maximum amount of data in optimal subcarriers. On the other side, subcarriers suffering excess Doppler effect or channel impairment can be dynamically removed from the data spreading table. In addition, the range and data rate can be adapted with a mesh network topology where far end units can still be reached through hops from end point to end point until the desired unit is reached. Also the mesh can adapt to the best path for one unit to another; for this a routing table should be maintained in the central unit. Central units can also communicate with adjacent central units with the mesh topology and multiple hops. This enables the creation of a dynamic and self-healing in-medium network and addresses/heals a number of failures that can happen. The target communication range of the unit 700 is approximately 300 feet in medium with a bandwidth of 30 KHz, a data rate of 50 Kbps, TDMA and OFDM, channel equalization with n subcarriers, sensor transmit power equal to 20 dBm and receive sensitivity sensor equal to −125 dBm.

Figure 8:
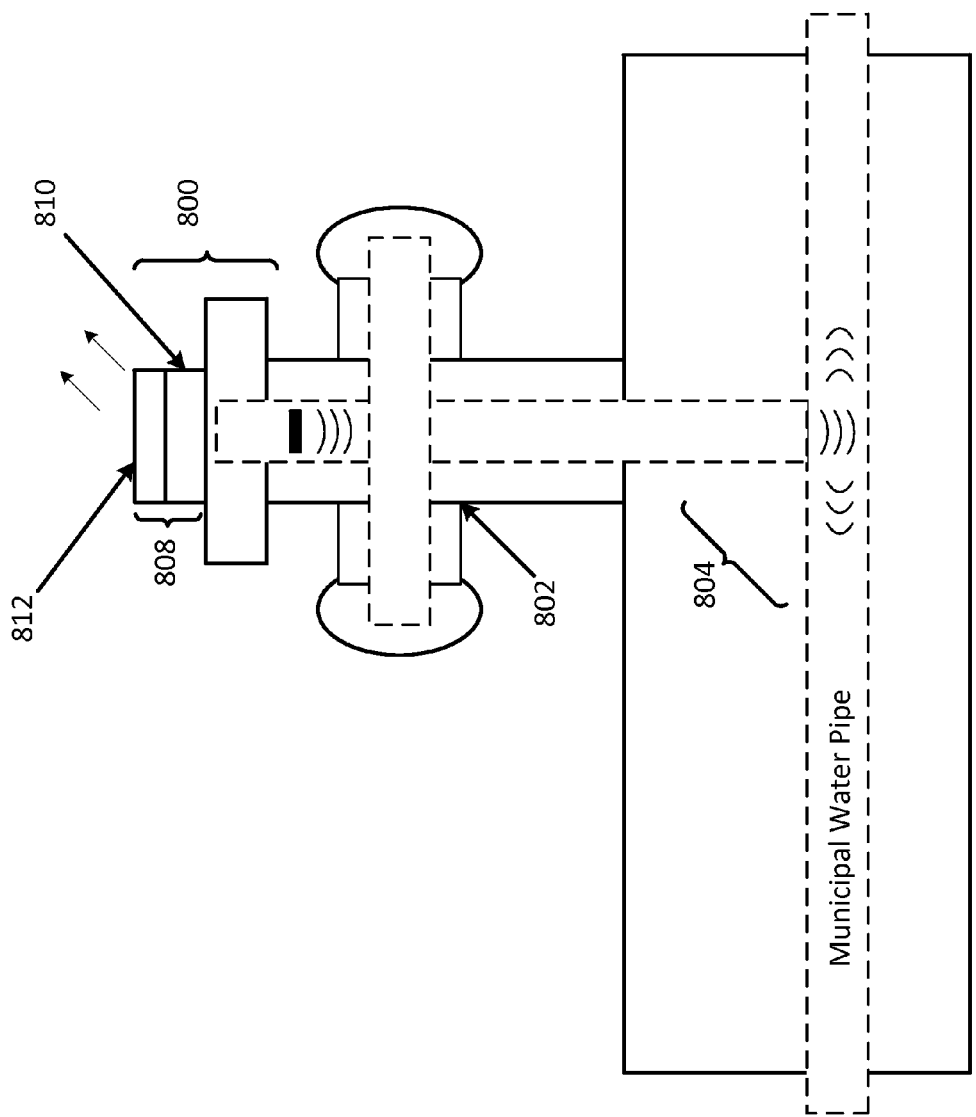
FIG. 8 is an illustration of an embodiment of a central unit mounted on a municipal water hydrant and configured for communication of data outside the pipe.

FIG. 8 illustrates an embodiment of a central unit 800 configured for long range communication over a fixed communication network outside of the medium of the municipal water pipe, in this instance. A fixed communication network may be wired or wireless. The unit 800 is mounted on top of a water hydrant 802 or other above ground surface connection to the pipe system 804. The unit 800 includes an acoustic sensor 806 for leak detection only that is placed within the medium, e.g., water, of the hydrant 802 to sample longitudinal sonic wavers within the pipe for the best range and sensitivity. The sensor 806 is connected to a hardware unit 808 that includes the circuitry and modules necessary, as described above, in the form of a processing and battery section 810 and a data communications section 812, to process the voltage signals output by the sensor 806 and to transmit the resulting data over a longer range to a central monitoring system (not shown). In wireless mode, using a WAN communication module and assuming coverage under the selected cellular network, the wireless range to the closest base station is long and in the order of miles or dozen of miles. In that case the range to the central monitoring system is transparent since a link can be established with it anywhere on Earth where a wireless/wired WAN network is available. In wired mode, the fixed communication network could make use of power line, phone lines, cable lines, or any other wired network within range of the unit 800.

Figure 9:
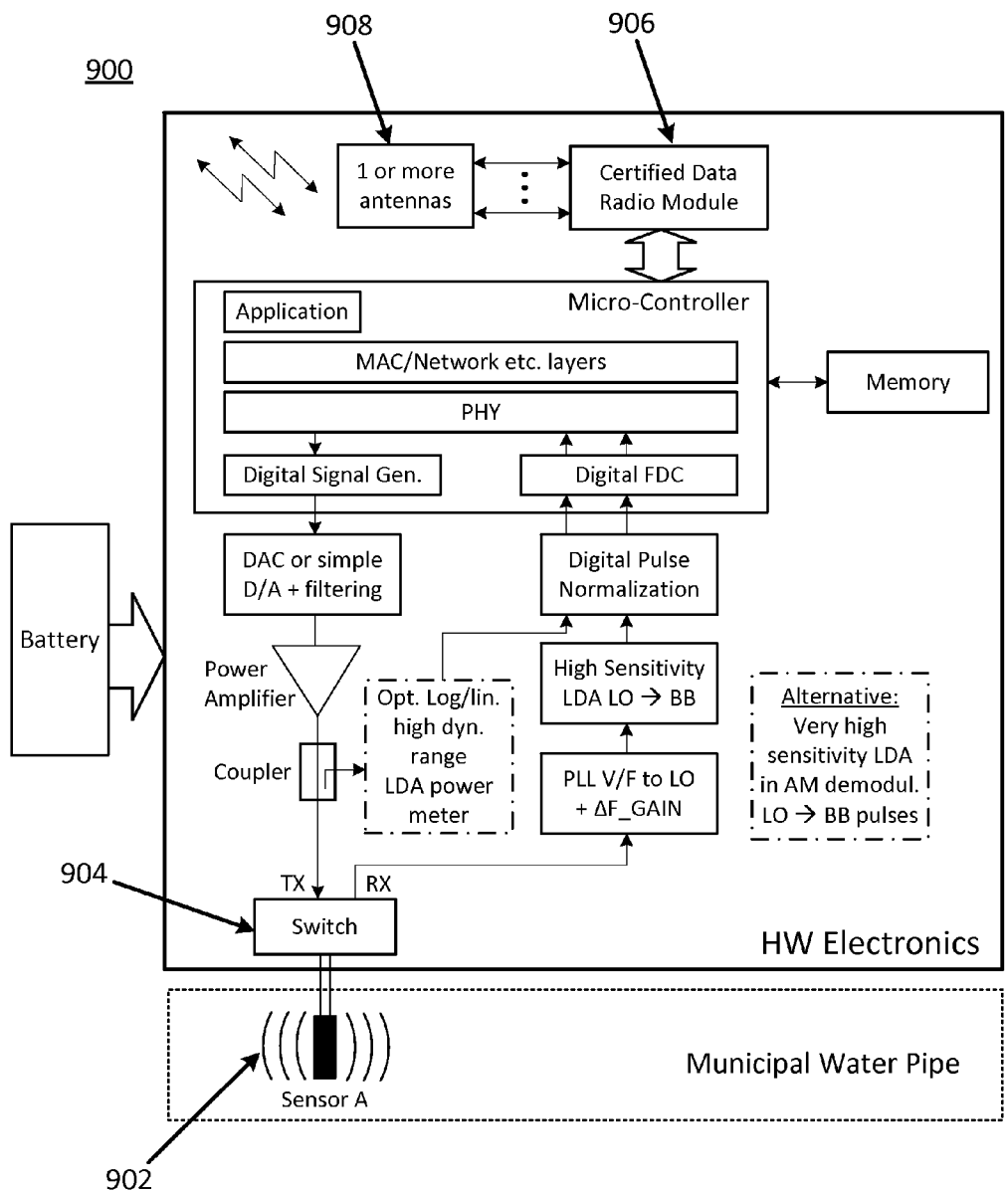
FIG. 9 is an illustration of an embodiment of a unit configured for transmission of data in-medium and outside the pipe.

FIG. 9 illustrates an embodiment of a unit 900 similar to that of unit 700 of FIG. 7, except that unit 900 includes a single acoustic sensor 902 and only one switch 904, and the micro-controller 410 is configured to communicate with a fixed network outside of the medium of the pipe containing the sensor 902, in a manner similar to that illustrated in FIG. 8. In the embodiment illustrated in FIG. 9, the unit 900 further includes a certified data radio module 906 connected to one or more antennas 908. The data radio module includes all of the circuitry and software necessary, such as RF transmitter, RF receiver, analog to digital converters ADCs, intermediate frequency synthesizers, physical layers, communication layers, memory, etc., and may communicate with any of a number of different types of fixed networks, such as a cellular wide area network (WAN) for instance GPRS or LTE, a cellular picocell network of end user subscribers, a cellular microcell network of super-user subscribers, an augmented WIFI network of super-user subscribers, or a proprietary fixed wide local area network (WLAN). Some of these various wireless communication protocols may be over licensed or unlicensed radio frequency bands. Examples of WLAN unlicensed bands for industrial, scientific & medical use are ISM 902-928 MHz in North America, and ISM 2400-2500 MHz & 5125-5875 MHz worldwide.

Figure 10:
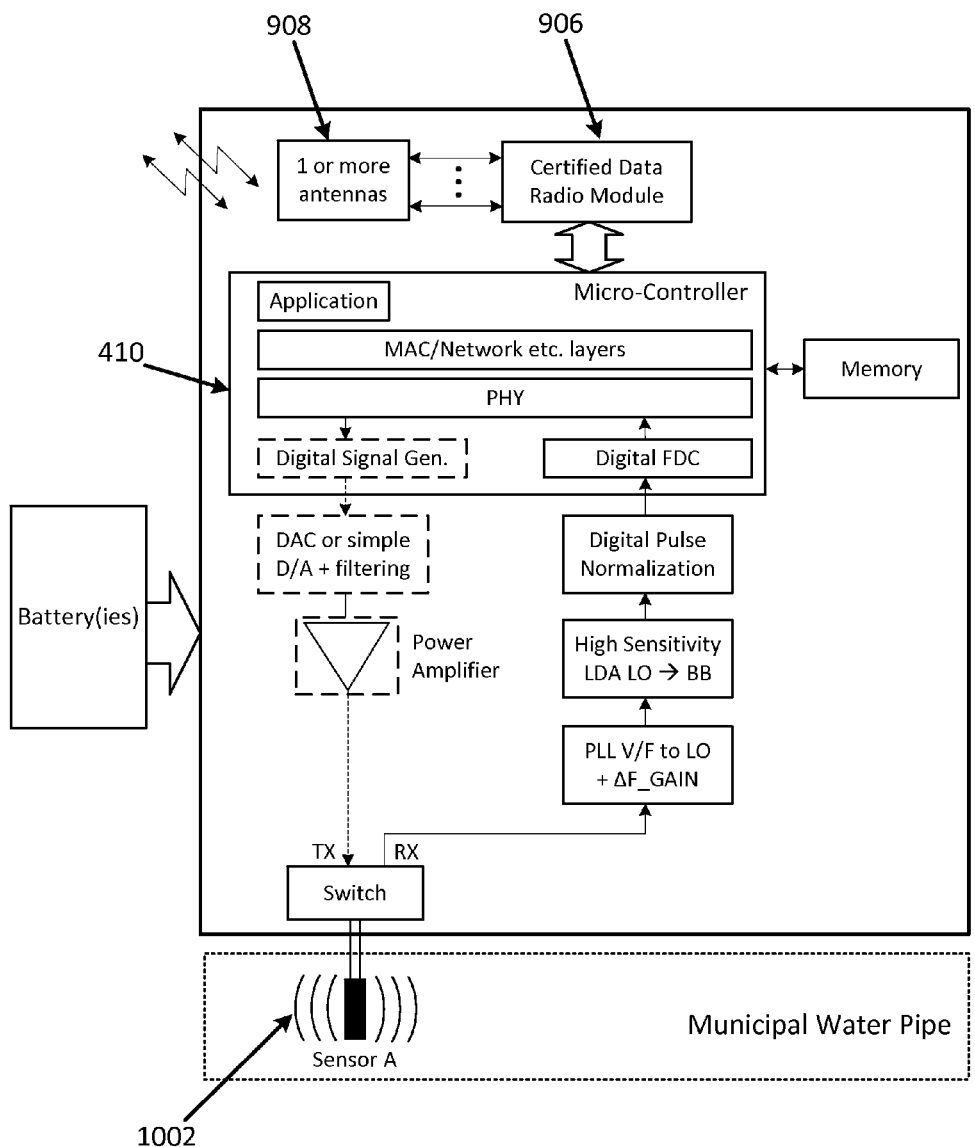
FIG. 10 is an illustration of an embodiment of a unit configured for transmission of data outside the pipe and optionally in-medium.

FIG. 10 illustrates a further embodiment in which the unit 1000 includes only a single acoustic sensor 1002 that operates in receive RX mode, e.g., 20 Hz to 5 KHz, and the data radio module 906 and antennas 908 of FIG. 9, and does not include any of the circuitry or modules (shown within dashed lines) normally necessary to communicate in medium through the sensor 1002.

Figure 11:
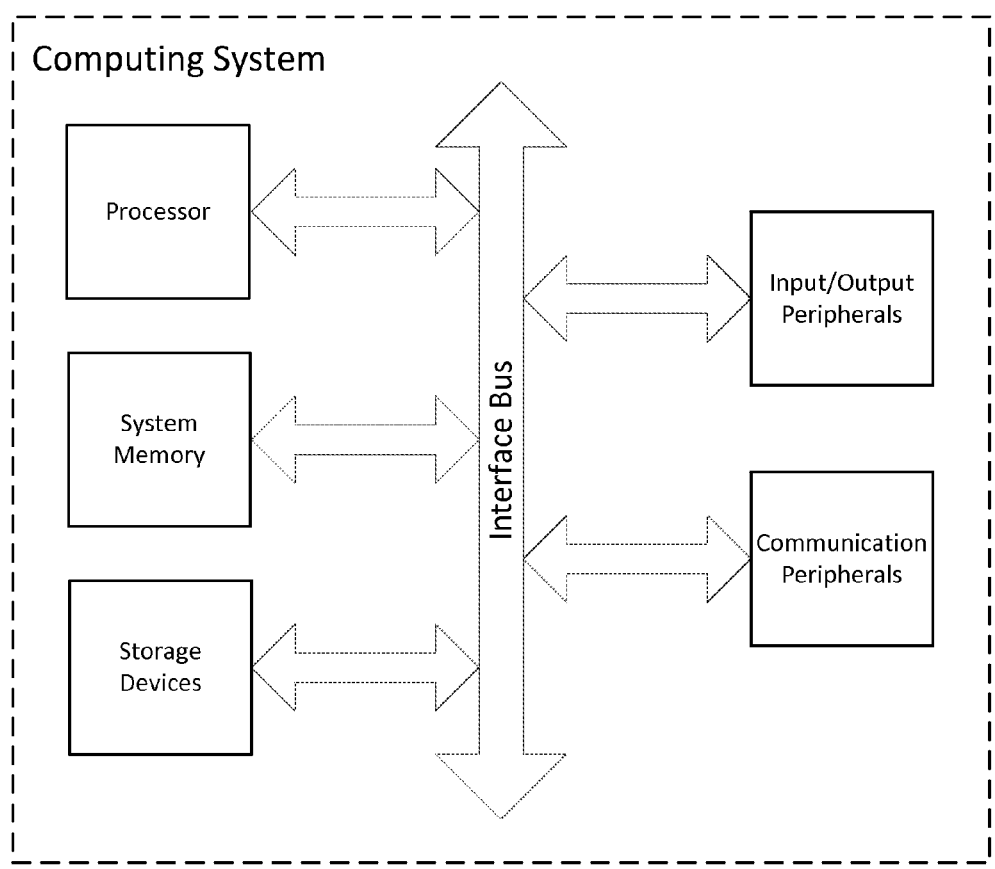
FIG. 11 is an illustration of an embodiment of a computing system.

The techniques described above may be implemented on a computing device, a plurality of computing devices, a server in communication with the computing device(s), or a plurality of servers in communication with the computing device(s). Additionally, the techniques may be distributed between the computing device(s) and the server(s). For example, the computing device may collect and transmit raw data to the server that, in turn, processes the raw data. FIG. 11 illustrates an exemplary block diagram of a computing system that includes hardware modules, software module, and a combination thereof and that can be implemented as the computing device and/or as the server.

In a basic configuration, the computing system may include at least a processor, a system memory, a storage device, input/output peripherals, communication peripherals, and an interface bus. The interface bus is configured to communicate, transmit, and transfer data, controls, and commands between the various components of the electronic device. The system memory and the storage device comprise computer readable storage media, such as RAM, ROM, EEPROM, hard-drives, CD-ROMs, optical storage devices, magnetic storage devices, flash memory, and other tangible storage media. Any of such computer readable storage medium can be configured to store instructions or program codes embodying aspects of the disclosure. Additionally, the system memory comprises an operation system and applications. The processor is configured to execute the stored instructions and can comprise, for example, a logical processing unit, a microprocessor, a digital signal processor, and the like.

The system memory and the storage device may also comprise computer readable signal media. A computer readable signal medium may include a propagated data signal with computer readable program code embodied therein. Such a propagated signal may take any of variety of forms including, but not limited to, electro-magnetic, optical, or any combination thereof. A computer readable signal medium may be any computer readable medium that is not a computer readable storage medium and that can communicate, propagate, or transport a program for use in connection with the computing system.

Further, the input and output peripherals include user interfaces such as a keyboard, screen, microphone, speaker, other input/output devices, and computing components such as digital-to-analog and analog-to-digital converters, graphical processing units, serial ports, parallel ports, and universal serial bus. The input/output peripherals may be connected to the processor through any of the ports coupled to the interface bus.

The user interfaces can be configured to allow a user of the computing system to interact with the computing system. For example, the computing system may include instructions that, when executed, cause the computing system to generate a user interface that the user can use to provide input to the computing system and to receive an output from the computing system.

This user interface may be in the form of a graphical user interface that is rendered at the screen and that is coupled with audio transmitted on the speaker and microphone and input received at the keyboard. In an embodiment, the user interface can be locally generated at the computing system. In another embodiment, the user interface may be hosted on a remote computing system and rendered at the computing system including remote smart phone, tablet, remote terminal, and web terminal. For example, the server may generate the user interface and may transmit information related thereto to the computing device that, in turn, renders the user interface to the user. The computing device may, for example, execute a browser or an application that exposes an application program interface (API) at the server to access the user interface hosted on the server.

Finally, the communication peripherals of the computing system are configured to facilitate communication between the computing system and other computing systems (e.g., between the computing device and the server) over a communications network. The communication peripherals include, for example, a network interface controller, modem, various modulators/demodulators and encoders/decoders, wireless and wired interface cards, antenna, and the like.

The communication network includes a network of any type that is suitable for providing communications between the computing device and the server and may comprise a combination of discrete networks which may use different technologies. For example, the communications network includes a cellular network, a WiFi/broadband network, a local area network (LAN), a wide area network (WAN), a telephony network, a fiber-optic network, or combinations thereof. In an example embodiment, the communication network includes the Internet and any networks adapted to communicate with the Internet. The communications network may be also configured as a means for transmitting data between the computing device and the server.

The techniques described above may be embodied in, and fully or partially automated by, code modules executed by one or more computers or computer processors. The code modules may be stored on any type of non-transitory computer-readable medium, specifically excluding signals, or computer storage device, such as hard drives, solid state memory, optical disc, and/or the like. The processes and algorithms may be implemented partially or wholly in application-specific circuitry. The results of the disclosed processes and process steps may be stored, persistently or otherwise, in any type of non-transitory computer storage such as, e.g., volatile or non-volatile storage.

The various features and processes described above may be used independently of one another, or may be combined in various ways. All possible combinations and sub-combinations are intended to fall within the scope of this disclosure. In addition, certain method or process blocks may be omitted in some implementations. The methods and processes described herein are also not limited to any particular sequence, and the blocks or states relating thereto can be performed in other sequences that are appropriate. For example, described blocks or states may be performed in an order other than that specifically disclosed, or multiple blocks or states may be combined in a single block or state. The example blocks or states may be performed in serial, in parallel, or in some other manner. Blocks or states may be added to or removed from the disclosed example embodiments. The example systems and components described herein may be configured differently than described. For example, elements may be added to, removed from, or rearranged compared to the disclosed example embodiments.

Conditional language used herein, such as, among others, "can," "could," "might," "may," "e.g.," and the like, unless specifically stated otherwise, or otherwise understood within the context as used, is generally intended to convey that certain embodiments include, while other embodiments do not include, certain features, elements, and/or steps. Thus, such conditional language is not generally intended to imply that features, elements and/or steps are in any way required for one or more embodiments or that one or more embodiments necessarily include logic for deciding, with or without author input or prompting, whether these features, elements and/or steps are included or are to be performed in any particular embodiment. The terms "comprising," "including," "having," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list.

An embodiment of in-medium monitoring system for monitoring material carried within a pipe comprises an acoustic device installed within the pipe and configured to at least generate a voltage signal indicative of changes in the material; a hardware unit including a detector module and a communication module; a switch connected to the acoustic detector for switching the voltage signal to the hardware unit; and a power source for the acoustic device, the hardware unit and the switch, wherein the hardware unit and power source are attached to the pipe.

In the embodiment, the detector module is a leak detector, and wherein the acoustic device includes an acoustic detector configured to monitor sound or pressure within the material indicative of a leak of the material from the pipe. In the embodiment, the acoustic device further includes an acoustic sensor configured to transmit processed data received from the communication module within the material within the pipe. In the embodiment, the communication module is a fixed network communication module configured to transmit processed data received from the communication module outside of the pipe. In the embodiment, the fixed network communication module is configured as part of a mesh network. In the embodiment, the fixed network communication module is configured to communicate with a wireless network or a wired network.

In the embodiment, the detector module is a flow meter, wherein the acoustic device includes two acoustic sensors configured to transmit and to receive signals within the material, and wherein the flow meter is configured to determine the flow rate of the material based on a differential time of flight between the transmitted and received signals at the two acoustic sensors. In the embodiment, the detector module includes a voltage to frequency converter configured to receive the voltage signal and output a modulated frequency signal that is modulated with data indicative of changes in the material extracted from the voltage signal. In the embodiment, the voltage to frequency converter is configured not to amplify the voltage of the voltage signal. In the embodiment, the voltage to frequency converter is configured to operate at an intermediate frequency and to output a modulated signal with data indicative of changes in the material extracted from the voltage signal. In the embodiment, the hardware unit further includes a log detection amplifier configured to receive the modulated frequency signal and to concurrently demodulate the modulated frequency signal in AM and FM modes. In the embodiment, the hardware unit further includes a pulse normalizer configured to shape the amplified pulsed output signal to form a digital-like output signal.

In the embodiment, the hardware unit further includes a micro-controller configured to form part of the detector module and part of the communication module and configured to receive the digital-like output signal, to determine a change in the material, and to output a digital signal indicative of the change. In the embodiment, the acoustic device includes an acoustic sensor configured to transmit data, wherein the hardware unit further includes a transmitter circuit configured to receive the digital signal indicative of the change from the micro-controller, to convert the signal to a modulated output signal, and to transmit the modulated output signal via the acoustic sensor. In the embodiment, the communication module is a fixed network communication module configured to transmit processed data received from the communication module outside of the pipe, wherein the communication module further includes a transmitter circuit configured to receive the digital signal indicative of the change from the micro-controller, to convert the signal to a transmit output signal, and to transmit the transmit output signal via the fixed network communication module.

In the embodiment, the hardware unit further includes a second log detection amplifier configured to receive the analog output signal from the transmitter circuit and generate a copy of the analog output signal over a wide dynamic range and with direct logarithmic conversion of RMS voltage to frequency for output to the pulse normalizer, wherein the pulse normalizer is configured to shape the copy of the analog output signal to form a digital-like copy of the analog output signal, and wherein the micro-controller is further configured to receive the digital-like copy of the analog output signal and generate an amplitude control circuit signal indicative of a value of the RMS amplitude of the transmitter amplified output signal. In the embodiment, the hardware unit further includes a variable module configured to provide an adjustable output level for the communication module. In the embodiment, the hardware unit further includes a second voltage to frequency converter configured to receive the analog output signal from the transmitter circuit and generate an amplified modulated frequency signal for input the second log detection amplifier.

In the embodiment, the acoustic device, the hardware unit, the switch and the power source are each part of one or more end point units installed on one or more end point water pipes to one or more end point locations; wherein the acoustic device, the hardware unit, the switch and the power source are also each part of one or more utility units installed on municipal water pipes connected to the one or more end point water pipes and configured to receive material monitoring data from the one or more end point units, and wherein the acoustic device, the hardware unit, the switch and the power source are also part of central unit configured to receive the material monitoring data from the one or more utility units to monitor the end point water pipes and the municipal water pipes. In the embodiment, the central unit monitors for leaks in the end point water pipes and in the municipal water pipes. In the embodiment, the central unit monitors flow rates in the end point water pipes and in the municipal water pipes. In the embodiment, the central unit is installed on water hydrant and monitors for leaks in the water hydrant.

While certain example embodiments have been described, these embodiments have been presented by way of example only, and are not intended to limit the scope of the inventions disclosed herein. Thus, nothing in the foregoing description is intended to imply that any particular feature, characteristic, step, module, or block is necessary or indispensable. Indeed, the novel methods and systems described herein may be embodied in a variety of other forms; furthermore, various omissions, substitutions and changes in the form of the methods and systems described herein may be made without departing from the spirit of the inventions disclosed herein. The accompanying claims and their equivalents are intended to cover such forms or modifications as would fall within the scope and spirit of certain of the inventions disclosed herein.

What is claimed:

1. An in-medium monitoring system for monitoring material carried within a pipe, comprising:

an acoustic device installed within the pipe and configured to at least generate a voltage signal indicative of a condition of the material, the condition indicative of extrinsic properties of the material;

a hardware unit including a detector module and a communication module, wherein the detector module includes a voltage to frequency converter configured to receive the voltage signal and output a modulated frequency signal that is modulated with data indicative of the condition of the material extracted from the voltage signal, and wherein the hardware unit further includes a log detection amplifier configured to receive the modulated frequency signal and to concurrently demodulate the modulated frequency signal in AM and FM modes;

a switch connected to the acoustic device for switching the voltage signal to the hardware unit; and a power source for the acoustic device, the hardware unit and the switch, wherein the hardware unit and power source are attached to the pipe.

2. The in-medium monitoring system of claim 1, wherein the detector module is a leak detector, and wherein the acoustic device includes an acoustic detector configured to monitor sound or pressure within the material indicative of a leak of the material from the pipe.

3. The in-medium monitoring system of claim 1, wherein the acoustic device further includes an acoustic sensor configured to transmit processed data received from the communication module within the material within the pipe.

4. The in-medium monitoring system of claim 1, wherein the communication module is a fixed network communication module configured to transmit, inside the pipe, processed data received from the communication module.

5. The in-medium monitoring system of claim 4, wherein the fixed network communication module is configured as part of a mesh network.

6. The in-medium monitoring system of claim 4, wherein the fixed network communication module is configured to communicate with a wireless network.

7. The in-medium monitoring system of claim 4, wherein the fixed network communication module is configured to communicate with a wired network.

8. The in-medium monitoring system of claim 1, wherein the detector module is a flow meter, wherein the acoustic device includes two acoustic sensors configured to transmit and to receive signals within the material, and wherein the flow meter is configured to determine the flow rate of the material based on a differential time of flight between the transmitted and received signals at the two acoustic sensors.

9. The in-medium monitoring system of claim 1, wherein the voltage to frequency converter is configured not to amplify the voltage of the voltage signal.

10. The in-medium monitoring system of claim 1, wherein the voltage to frequency converter is configured to operate at an intermediate frequency and to output a modulated signal with data indicative of the condition of the material extracted from the voltage signal.

11. The in-medium monitoring system of claim 1, wherein the hardware unit further includes a pulse normalizer configured to shape the amplified pulsed output signal to form an output signal.

12. The in-medium monitoring system of claim 11, wherein the hardware unit further includes a micro-controller configured to form part of the detector module and part of the communication module and configured to receive the output signal, to determine the condition of the material, and to output a digital signal indicative of the condition.

13. The in-medium monitoring system of claim 12, wherein the acoustic device includes an acoustic sensor configured to transmit data, wherein the hardware unit further includes a transmitter circuit configured to receive the digital signal indicative of the condition from the micro-controller, to convert the signal to a modulated output signal, and to transmit the modulated output signal via the acoustic sensor.

14. The in-medium monitoring system of claim 12, wherein the communication module is a fixed network communication module configured to transmit processed data received from the communication module outside of the pipe, wherein the communication module further includes a transmitter circuit configured to receive the digital signal indicative of the condition from the micro-controller, to convert the digital signal to a transmit output signal, and to transmit the transmit output signal via the fixed network communication module.

15. The in-medium monitoring system of claim 14, wherein the hardware unit further includes a second log detection amplifier configured to receive the analog output signal from the transmitter circuit and generate a copy of the analog output signal over a wide dynamic range and with direct logarithmic conversion of RMS voltage to frequency for output to the pulse normalizer, wherein the pulse normalizer is configured to shape the copy of the analog output signal to form a copy of the analog output signal, and wherein the micro-controller is further configured to receive the copy of the analog output signal and generate an amplitude control circuit signal indicative of a value of the RMS amplitude of the transmitter amplified output signal.

16. The in-medium monitoring system of claim 15, wherein the hardware unit further includes a variable module configured to provide an adjustable output level for the communication module.

17. The in-medium monitoring system of claim 15, wherein the hardware unit further includes a second voltage to frequency converter configured to receive the analog output signal from the transmitter circuit and generate an amplified modulated frequency signal for input the second log detection amplifier.

18. The in-medium monitoring system of claim 1, wherein the acoustic device, the hardware unit, the switch and the power source are each part of one or more end point units installed on one or more end point water pipes to one or more end point locations; wherein the acoustic device, the hardware unit, the switch and the power source are also each part of one or more utility units installed on municipal water pipes connected to the one or more end point water pipes and configured to receive material monitoring data from the one or more end point units, and wherein the acoustic device, the hardware unit, the switch and the power source are also part of central unit configured to receive the material monitoring data from the one or more utility units to monitor the end point water pipes and the municipal water pipes.

19. The in-medium monitoring system of claim 18, wherein the central unit monitors for leaks in the end point water pipes and in the municipal water pipes.

20. The in-medium monitoring system of claim 18, wherein the central unit monitors flow rates in the end point water pipes and in the municipal water pipes.

21. The in-medium monitoring system of claim 18, wherein the central unit is installed on water hydrant and monitors for leaks in the water hydrant.

22. An in-medium monitoring system for monitoring material carried within a pipe, comprising:
- an acoustic device installed within the pipe and configured to at least generate a voltage signal indicative of a condition of the material, the condition indicative of extrinsic properties of the material;
- a hardware unit including a detector module and a communication module, wherein the detector module includes a log detection amplifier configured to receive the voltage signal, to detect data indicative of the condition the material, and to demodulate the voltage signal in AM and FM modes;
- a switch connected to the acoustic device for switching the voltage signal to the hardware unit; and
- a power source for the acoustic device, the hardware unit and the switch, wherein the hardware unit and power source are attached to the pipe.

23. The in-medium monitoring system of claim 22, wherein the detector module further includes a voltage to frequency converter configured to receive the voltage signal and output a modulated frequency signal that is modulated with the data indicative of the condition of the material that was extracted from the voltage signal and to input the modulated frequency signal to the log detection amplifier in place of the voltage signal.

* * * * *